(12) United States Patent
Gulses et al.

(10) Patent No.: US 10,090,639 B2
(45) Date of Patent: Oct. 2, 2018

(54) LASER DIODE ENHANCEMENT DEVICE

(71) Applicant: LUMINIT LLC, Torrance, CA (US)

(72) Inventors: Alkan Gulses, Gardena, CA (US);
Russell Kurtz, Palos Verdes Estates, CA (US)

(73) Assignee: Luminit LLC, Torrance, CA (US)

( * ) Notice: Subject to any disclaimer, the term of this patent is extended or adjusted under 35 U.S.C. 154(b) by 0 days.

(21) Appl. No.: 15/411,581

(22) Filed: Jan. 20, 2017

(65) Prior Publication Data

US 2017/0227700 A1    Aug. 10, 2017

Related U.S. Application Data

(60) Provisional application No. 62/281,447, filed on Jan. 21, 2016.

(51) Int. Cl.
| | |
|---|---|
| H01S 5/00 | (2006.01) |
| H01S 5/062 | (2006.01) |
| H01S 5/343 | (2006.01) |
| H01S 5/183 | (2006.01) |
| H01S 5/14 | (2006.01) |
| H01S 3/08 | (2006.01) |
| H01S 5/04 | (2006.01) |
| H01S 3/10 | (2006.01) |

(52) U.S. Cl.
CPC ...... *H01S 5/06246* (2013.01); *H01S 3/08045* (2013.01); *H01S 3/08068* (2013.01); *H01S 5/041* (2013.01); *H01S 5/14* (2013.01); *H01S 5/141* (2013.01); *H01S 5/145* (2013.01); *H01S 5/183* (2013.01); *H01S 5/18358* (2013.01); *H01S 5/18361* (2013.01); *H01S 5/18391* (2013.01); *H01S 5/34313* (2013.01); *H01S 3/10053* (2013.01); *H01S 5/18363* (2013.01); *H01S 2301/04* (2013.01)

(58) Field of Classification Search
CPC .. H01S 5/18361; H01S 5/187; H01S 5/34313; H01S 5/14; H01S 5/145; H01S 5/183; H01S 5/06246; H01S 5/18358; H01S 3/10053; H01S 2301/04
See application file for complete search history.

(56) References Cited

U.S. PATENT DOCUMENTS

| | | | | |
|---|---|---|---|---|
| 5,627,847 A | * | 5/1997 | Leger | G02B 5/1871 |
| | | | | 359/559 |
| 6,141,361 A | * | 10/2000 | Mears | G02B 5/203 |
| | | | | 359/237 |
| 6,947,453 B2 | * | 9/2005 | Sidorin | H01S 5/141 |
| | | | | 372/102 |

(Continued)

OTHER PUBLICATIONS

Gulses, et al., "Cascaded Diffractive Optical Elements for Improved Multiplane Image Reconstruction," Allied Optics, vol. 52, No. 15, May 20, 2013 pp. 3608-3616.

*Primary Examiner* — Kinam Park
(74) *Attorney, Agent, or Firm* — Husch Blackwell LLP

(57) ABSTRACT

The subject invention includes a semiconductor laser with the laser having a DBR mirror on a substrate, a quantum well on the DBR mirror, and an interior CGH with a back propagated output for emitting a large sized Gaussian and encircling high energy. The DBR mirror has a plurality of GaAs/AlGaAs layers, while the quantum well is composed of AlGaAs/InGaAs. The CGH is composed of AlGaAs.

5 Claims, 9 Drawing Sheets

(56) References Cited

U.S. PATENT DOCUMENTS

| | | | |
|---|---|---|---|
| 9,134,538 B1* | 9/2015 | Augst | G02B 27/106 |
| 2002/0045104 A1* | 4/2002 | Efimov | G03H 1/02 |
| | | | 430/2 |
| 2002/0067882 A1* | 6/2002 | Guilfoyle | G02B 6/43 |
| | | | 385/24 |
| 2003/0026314 A1* | 2/2003 | Hwu | H01S 5/14 |
| | | | 372/92 |
| 2008/0165821 A1* | 7/2008 | Raab | H01S 3/08 |
| | | | 372/96 |

* cited by examiner

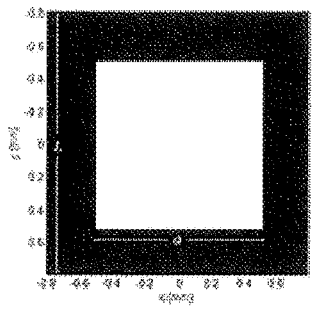
FIG. 3(a)
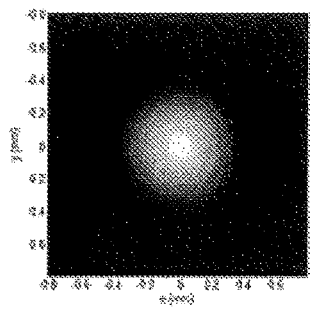       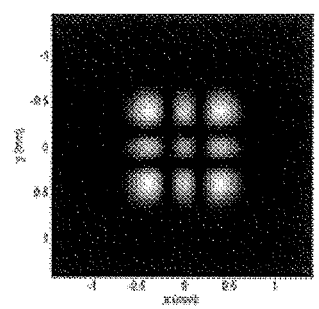       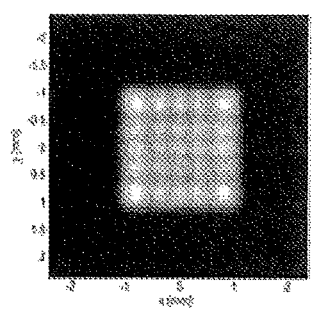
FIG. 3(b)              FIG. 3(c)              FIG. 3(d)
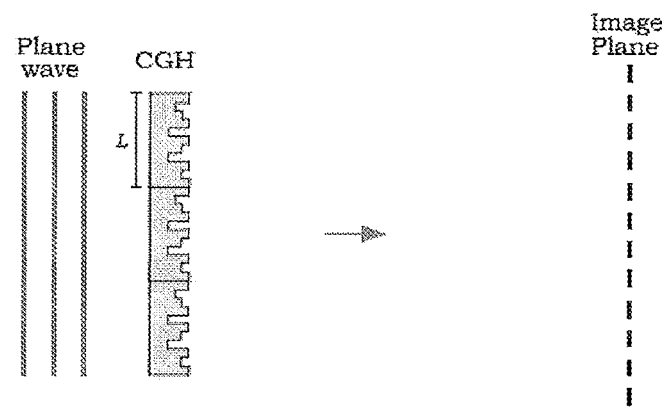
FIG. 4

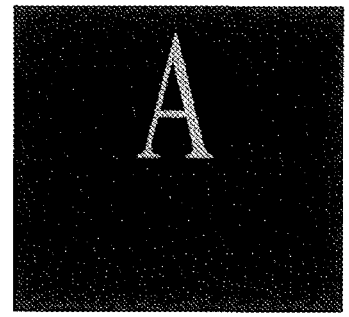 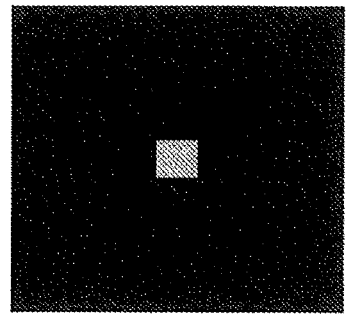
FIG. 5(a)   FIG. 5(b)
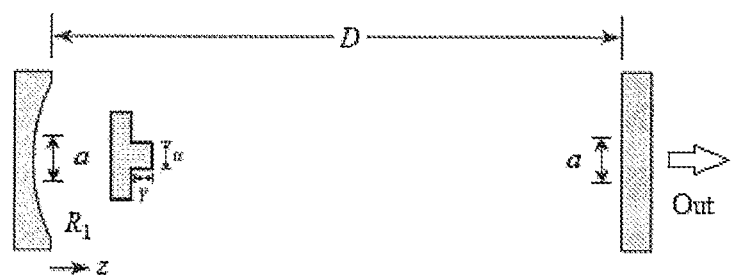
FIG. 6
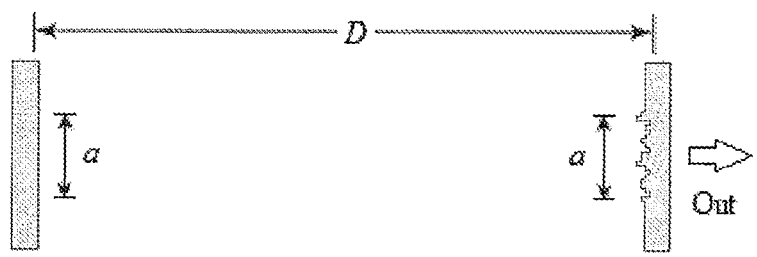
FIG. 7

LASER DIODE ENHANCEMENT DEVICE

BACKGROUND OF THE INVENTION

Obtaining lasers with both high optical power and good beam quality simultaneously has always been a difficult task. Vertical External Cavity Surface Emitting Lasers (VECSELs) are modifications to Vertical Cavity Surface Emitting Lasers (VCSELs), where a semiconductor gain medium is sandwiched between distributed Bragg reflectors (DBRs). In these laser systems, laser emissions are observed perpendicular to the surface, giving them a relatively low beam divergence and symmetric beam profile. VCSELs are quite convenient devices for certain applications; however, high power and high beam quality cannot be achieved together with conventional edge- or surface-emitting semiconductor lasers. Thus, optically pumped VECSELs have received considerable attention recently. They provide excellent beam quality and relatively high output powers. They achieve these properties due to their one-sided external cavity mirrors, which elongate the cavity. The longer the cavity is, the bigger the modes that come out; thus, a reduced number of modes contribute to the high-power beam purity. In addition, a longer cavity causes a finer laser bandwidth. On the other hand, the external cavity in VECSELs causes extra bulk by reducing robustness, alignment, and size, weight, and power (SWAP). To reduce the bulk to increase operability, diffractive optical elements (DOEs) can be utilized in VECSELs.

New technologies are now sought as well as innovative approaches to use DOEs in VCSEL chips for high-power applications to compensate for very short cavity length. Until now, research has focused on the adaptability of DOEs to certain laser systems in the academic domain. However, none of this work resulted in serious investigation of the feasibility of fabricating a VECSEL with an integrated DOE, nor was the full potential of diffractive optics for an extra-improved quality high-power laser system researched by investigating the latest innovations in laser and computer-generated DOE literature, specifically, computer-generated holograms (CGHs).

A CGH-based Improved VECSEL Cavity (CIVC), shown conceptually in FIG. 1 is proposed. FIG. 1 shows a set of DOEs placed with buffer layers in a cascaded state. This concept of cascaded CGHs is introduced to obtain certain laser functions. The most important property of the CIVC design is the freedom of performance merits. This design of a wavefront modulating scheme allows several diffractive structures to function to give the desired performance merits, as desired. Principally, the CIVC can be used to shape the laser modes as though there is an external mirror; at the same time, it may work to shape the output (as a flattop, for example).

Today lasers are used in a wide range of diverse applications, such as optical fiber communication, optical digital recording, materials processing, biophotonics, spectroscopy, imaging, entertainment, and defense. Therefore, it is very important to model fundamental laser operation computationally. FIG. 2 shows a simple abstraction of a laser cavity resonator. Physically, electromagnetic radiation is reflected back and forth for the amplification of the radiation in a closed volume defined by a length D and an aperture a. In a broader sense, cavities have two main considerations: the stability criterion imposed by the end-reflector mirrors and the structure of modes created by the cavity geometry. The former basically sets limits on the sustainability of the amplification. Based on the ray model of geometrical optics under paraxial approximation, light rays experience periodic focusing. This effect can also be considered as an outcome caused by the continuum sequence of lenses. For the particular system shown, the stability condition coming from the ray model analysis simply yields $$R_1 > D > 0 \quad (1)$$

Equation (1) states that the cavity length must be smaller than the radius of curvature of the first mirror for a stable operation ensuring self-focusing. In fact, D is crucial for the operation of the device. Another important figure of merit is a, since it adjusts the volume of oscillations and is responsible from mode sizes and shapes. If the laser is optically pumped, the mirrors' coatings should be selected accordingly; also, the output mirror's (out-coupler: Mirror 2 in this case) coating should allow ~10% transmittance for the resonant wavelength.

Basically, the Fox-Li algorithm states that in a Fabry-Perot resonator cavity, oscillating modes travel back and forth between mirrors and lose energy as they are being diffracted by apertures. After enough round-trips, the electric field becomes stable so that it repeats itself in each round-trip, yielding eigenvalues and Eigen functions of that specific cavity. By considering non-negative integers p and l that define mode numbers, an eigenvalue equation for a closed cavity can be written as $$\hat{P}\Psi_{pl} = \gamma_{pl}\Psi_{pl} \quad (2)$$

In Equation (2), $\hat{P}$ is the round-trip propagation operator responsible from propagation of the field one round-trip. Eigenfunctions ($\Psi$) are the possible E-fields and can be solutions of the wave equation (subject to boundaries) with eigenvalues $\gamma_{pl}$. As a consequence of the principle of superposition, the total field U in a laser cavity can be expanded as linear combinations of these eigenfunctions.

$$U = \sum_{p,l} c_{pl}\Psi_{pl}. \quad (3)$$

The constant $c_{pl}$ adjusts weights for eigenfunctions and depends mainly on the cavity shape as well as initial conditions. At the point of saturation, oscillating fields do not change shape from $k^{th}$ to $(k+1)^{nth}$ round-trip iteration. Then in an orthogonal space, one can define specific modes as follows.

$$\Psi_{pl}^{(k+1)} = (\gamma_{pl})^k \Psi_{pl}^{(k)} \quad (4)$$

As the way these modes' relative strength (with respect to each other) is expressed by $c_{pl}$, their evolution with respect to the round-trip operator is given by the constant $\gamma_{pl}$. Equation (4) implies a change between round-trips. The constant depends on the apertures and diffraction losses coming from these apertures. Although this equation predicts the disappearance of every mode eventually, the power feedback from the laser prevents that. Since lower order mode sizes are smaller, they are favored to propagate. As a consequence, $\gamma_{00}$ is expected to be the largest with respect to the other mode constants. This corresponds to the fundamental $TEM_{00}$ mode, with Gaussian shape. In fact, although lasers fundamentally tend to oscillate in higher index modes based on the supplied energy, due to diffraction and absorption effects at apertures, intensities of the higher modes may gradually be dissipated and disappear. The issue of how many modes are allowed depends on the aperture size; the larger the aperture, the higher the modes that can be excited, thus more power goes into these modes.

To determine the available set of modes in a resonator, the cavity is simulated by defining each element as an operator, considering the cavity as a continuum that provides successive propagation, and exchanging mirrors with lenses doing the same function. As a consequence, This system reaches equilibrium, demonstrating the output of the laser with its constituent mode patterns. Operator notation is given in Table 1 for some common cavity elements.

In Table 1, $\hat{L}$, $\hat{A}$, and $\hat{H}$ operators are shown. Note that the propagation operator is chosen based on the relation between propagation distance (equal to the cavity length, D), sampling interval, $\rho$, and feature size length of the medium under consideration, L. The spatial frequencies ($f_x, f_y$) are computed on a grid from max to min with steps $1/L$. From the Nyquist-Shannon sampling theorem, $f_{max}$ and $f_{min}$, are $\pm 1/(2\rho)$.

The final operator $\hat{P}$ is found by multiplying these individual operators by following the sequence. For example, a simple resonator starts with a lens covered by an aperture, then propagation in the cavity, followed by a planar mirror that is just represented by a simple aperture again, and finally propagation back to the starting point. Thus, we have $\hat{P}=\hat{H}\hat{A}\hat{H}\hat{A}\hat{L}$. The operator order goes from left to right. The operator $\hat{H}$ is applied in the Fourier domain; this means that the field right before applying the propagator is transformed, multiplied with the relevant $\hat{H}$, then inverse transformed back to the spatial domain. All operators and fields can be thought of as matrices; all multiplications are element-wise matrix multiplications. Therefore, successive application of $\hat{P}$ yields the desired output mode pattern. Some simulation results can be seen in FIG. 3(a)-(d).

$$I(r, z) = I_0 \left(\frac{w_0}{w(z)}\right)^2 \exp\left[-\frac{2(x^2+y^2)}{w(z)^2}\right], \quad (5)$$

where $$w(z) = w_0 \sqrt{1 + \left(\frac{z}{z_R}\right)^2}. \quad (6)$$

The constant $z_R$ is Rayleigh length, and is equal to $\pi w_0^2/\lambda$. Therefore, in free-space propagation of the Gaussian beam, the beam waist is minimum when z is zero and is equal to $w_0$ according to Equation (6). Minimum beam waist is a constant, and the location depends on the laser. If there is a lens, $w_0$ is observed at the focal point. As the beam propagates, beam waist w is actually the radius at which the intensity drops to $1/e^2$ times that of the central maximum, and it increases according to Equation (6). Throughout this study, we measured beam diameters with 2w by calling them the beam waist (although more correctly this is a diameter) between the $1/e^2$ power points Rectangular geometry is principally displayed, however cylindrical geometry gives similar trends.

SUMMARY OF THE INVENTION

The subject invention includes a semiconductor laser with the laser having a DBR mirror on a substrate, a quantum well on the DBR mirror, and an interior CGH with a back propagated output for emitting a large sized Gaussian and encircling high energy. The DBR mirror has a plurality of GaAs/AlGaAs layers, while the quantum well is composed of AlGaAs/InGaAs. The CGH is composed of AlGaAs, layers with a buffer layer of GaAs. A further embodiment of the subject invention is a semiconductor laser comprising a plurality of at least 2 interior cascaded CGHs. There may be anywhere from 2-20 interior CGHs, and possibly more than 20.

TABLE 1

| Common Operators | |
|---|---|
| Operator | Explanation |
| $\hat{L} = \exp\left[\frac{-ik}{R_1}(x^2+y^2)\right]$ | Lens function, creates focusing effect as a concave mirror would do. k is the wave-number. |
| $\hat{A} = \text{rect}\left(\frac{x}{a}\right)\text{rect}\left(\frac{y}{a}\right)$ | Aperture function for rectangular geometry. |
| $\hat{A} = \text{circ}\left(\frac{r^2}{a/2}\right)$ | Aperture function for cylindrical geometry. |
| $H = \exp[-i\pi\lambda D(f_x^2 + f_y^2)]$ | Free-space propagator for a distance z, if $z \leq \rho L/\lambda$. |
| $\hat{H} = \mathfrak{F}\left\{\frac{1}{i\lambda D}\exp\left[\frac{-i\pi}{\lambda D(x^2+y^2)}\right]\right\}$ | Free-space propagator for a distance z, if $z > \rho L/\lambda$. $\mathfrak{F}$ denotes Fourier transform. |

FIG. 3(a) shows a rectangular cavity aperture example. In simulations, L indicates the total area assigned, which always contains 64×64 pixels. The aperture is a, and always contains 40×40 pixels. While its value is increased step-by-step, the increment in mode numbers increases as a general trend. D is always 15 cm. FIG. 3(b)-(d) show three results: on the left-hand side, a $TEM_{00}$ or Gaussian beam for a=1 mm, with diameter 0.8 mm; in the middle, a $TEM_{22}$; and on the right-hand, side a collection of modes. Gaussian beams were examined because of their well-behaved long-distance propagation. The intensity pattern is defined in Equation (5).

CONCISE DESCRIPTION OF THE DRAWINGS

FIG. 2 shows the basic schematics of a laser cavity with length D and aperture a.

FIG. 3(a) shows rectangular cavity cross-section for a=1 mm.

FIG. 3(b), FIG. 3(c) and FIG. 3(d) shows results for various aperture values with D=15 cm. from left to right, a=1 mm, a=1.8 mm, and a=3 mm.

FIG. 4 shows a CGH comprising unit cells of dimension L×L. The desired waveform Is formed(reconstructed) at the image plane.

FIG. 5(a) and FIG. 5(b) show Illustrative simulation results: 'A' Letter and Flattop.

FIG. 6 is a laser cavity with a DOE.

FIG. 7 is a laser cavity with a CGH Mirror. D Is 15 cm, a Is 6 mm.

Figure 1:
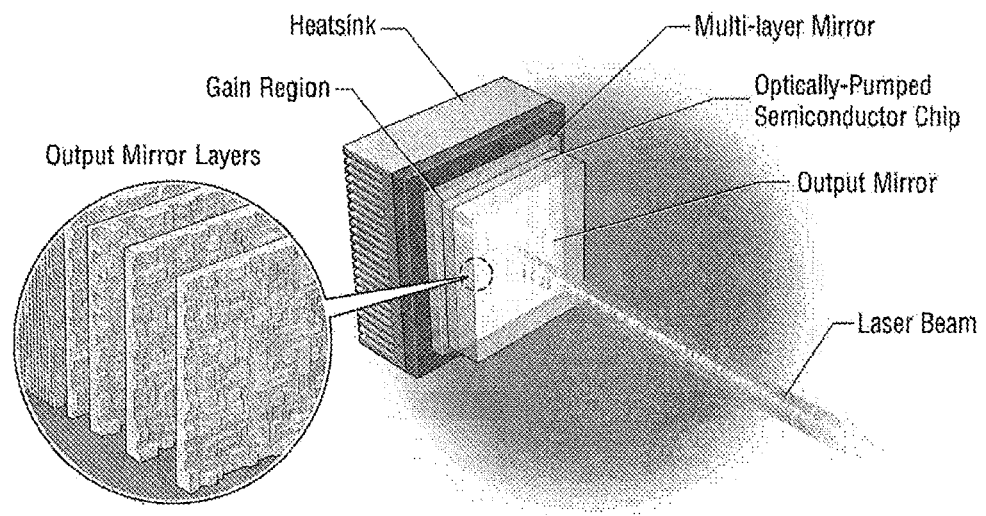
FIG. 1 shows the CIVC in Use, Demonstrated Conceptually.
Figure 2:
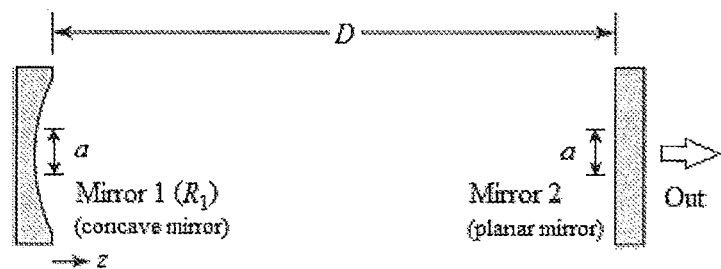
Figure 8A:
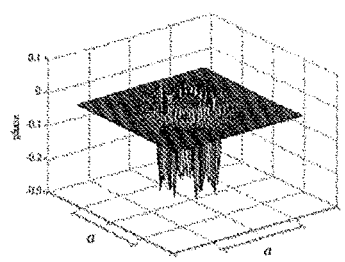

FIG. 8(a) shows a 3D CGH surface relief profile with light coming from the bottom.

Figure 8B:
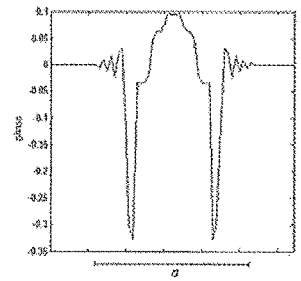

FIG. 8(b) is a cross-section of the CGH.

Figure 8C:
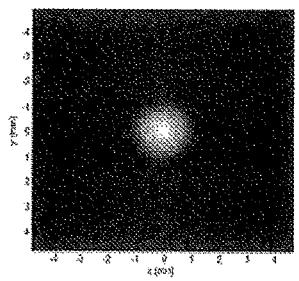

FIG. 8(c) is a beam with 2.7 mm waist length.

Figure 9:
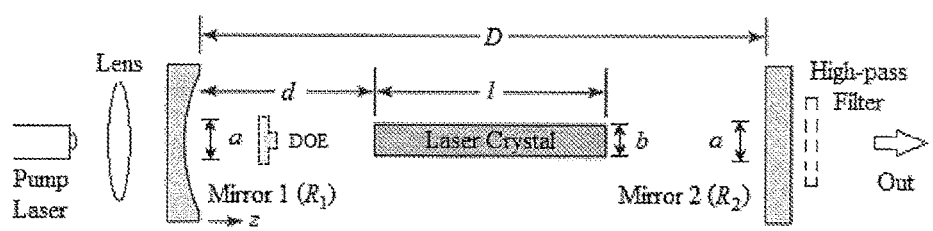

FIG. 9 is a schematic of Example 1.

Figure 10:
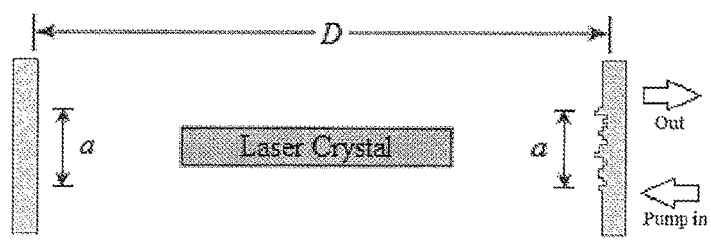

FIG. 10 is a laser cavity with a diffractive mirror.

Figure 11:
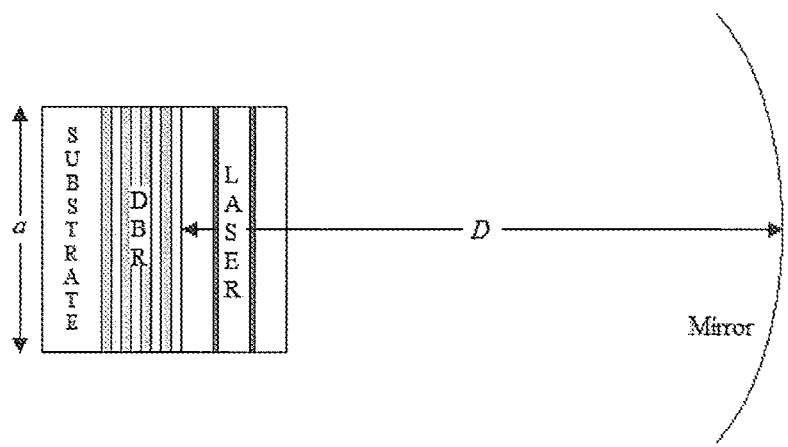

FIG. 11 is a conventional VECSEL cavity schematic.

Figure 12A:
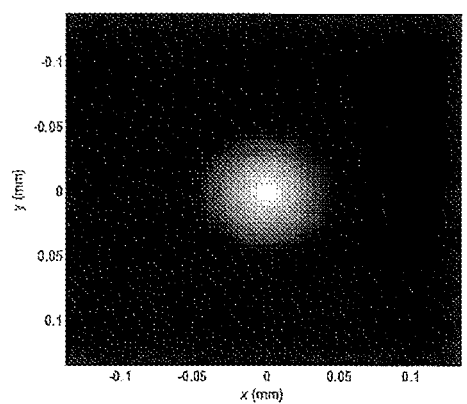

FIG. 12(a) shows the output of a laser with D=1 mm and $a_{max}$=170 μm.

Figure 12B:
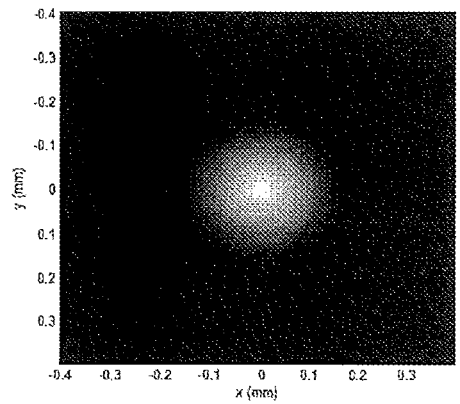

FIG. 12(b) shows the output of a laser with D=20 mm and $a_{max}$=500 μm.

Figure 13:
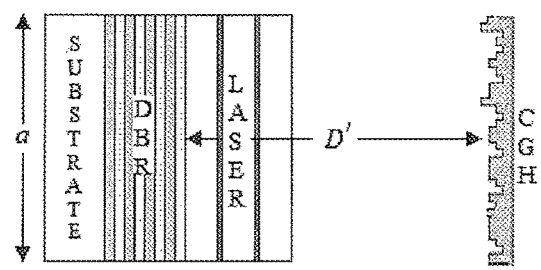

FIG. 13 is a representation of the laser and replaced cavity mirror.

Figure 14A:
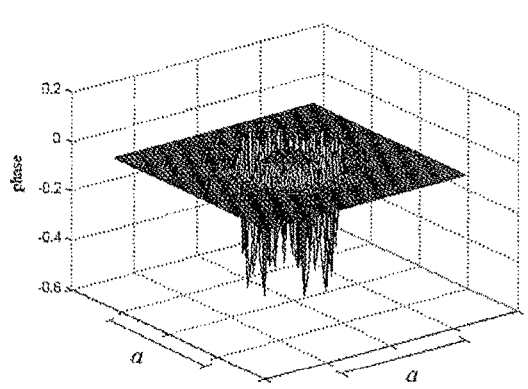

FIG. 14(a) is a CGH profile with light coming from the bottom.

Figure 14B:
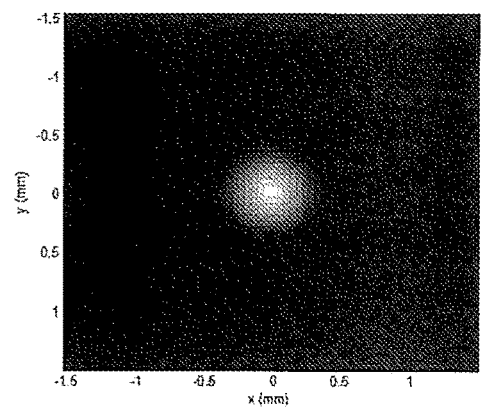

FIG. 14(b) shows the result: beam diameter Is 850 μm, with an aperture 1.9 mm. The CGH can replace the mirror by helping to extend the mode size.

Figure 15:
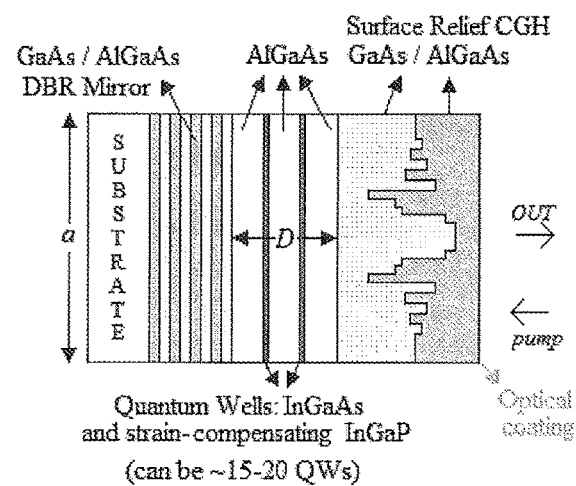

FIG. 15 shows a computer-generated hologram (CGH) for mode shaping in lasers.

Figure 16A:
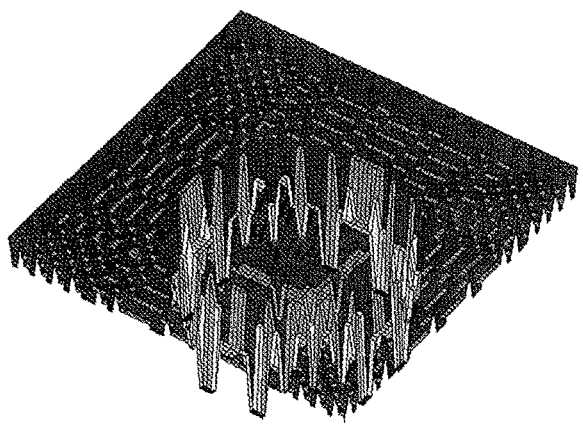

FIG. 16(a) is a depiction of a CGH of the integrated invention (light direction is from the bottom).

Figure 16B:
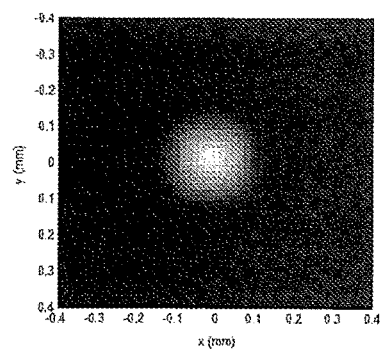

FIG. 16(b) shows the result with a diameter of almost 300 μm Gaussian.

Figure 17:
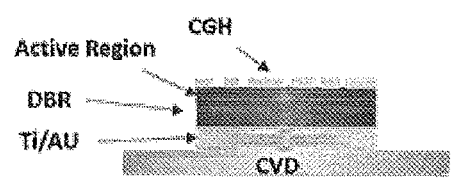

FIG. 17 is a schematic of a fully processed VECSEL sample with surface CGH.

Figure 18:
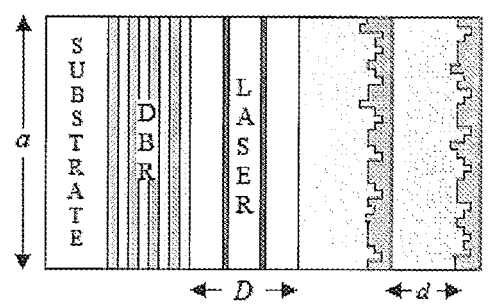

FIG. 18 shows an integrated VECSEL cavity with on-chip mounted double CGHs. These elements have some separation distance d between them.

Figure 19:
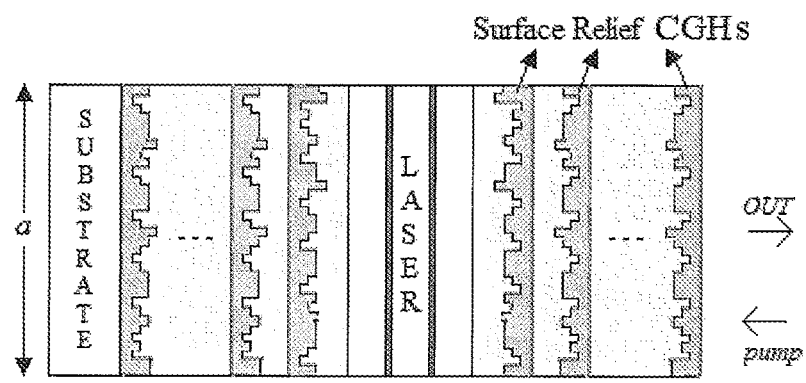

FIG. 19 depicts Computer generated holograms (CGHs) in place of distributed Bragg reflectors (DBRs) for mode sharing in lasers.

Figure 20:
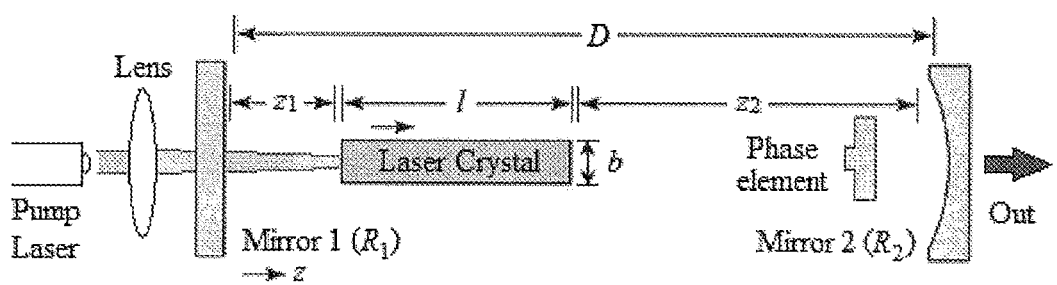

FIG. 20 shows the utilization of a transparent phase element to replace opaque apertures in lasers.

DETAILED DESCRIPTION OF SEVERAL EMBODIMENTS OF THE INVENTION

Free-Space CGHs

In free-space simulations a unit amplitude plane wave is considered to interact with the CGH for beam and image correction. Many design methods can be used to create surface relief profiles operating as CGHs. One way of solving the problem and increasing the quality is to use iterative methods such as the iterative Fourier transform algorithm (IFTA). One basic way of implementing IFTA is the Gerchberg-Saxton (GS) or error-reduction algorithm for phase element design. Due to constraints like phase quantization and amplitude extraction on the hologram side, a perfect solution is not possible.

A unit cell is started with a random grid of phase values. Forward propagation is fulfilled, and desired amplitude distribution is imposed at the output plane while keeping the phases unchanged. An inverse propagation is then applied, and all intensity values are reset to one for a pure phase hologram at the input plane. So, phases are constantly iterated while desired amplitudes are imposed at the input and output. The propagations can use the propagator functions in Table 1 depending on the distance. Also, as a common scenario, for a relatively large distance or a lens in the system, bare Fourier transformation can be used. In this case, large distance ensures high image quality that also depends on the pixel size. The CGH can be tiled to increase the space bandwidth product, after the design stage. Some simulation results are shown in FIG. 5.

Intra-Cavity CGHs

Inserting some specially shaped phase elements in a resonator can help improve beam parameters. FIG. 6 shows a laser diagram with a step-function type intra-cavity phase DOE. In simulations, the mathematical function of the element is entered in operator notation. The entire system is then simulated with the Fox-Li approach as before. The total system round-trip operator is $\hat{P}=\hat{H}\hat{A}\hat{H}\hat{D}*\hat{A}\hat{L}\hat{D}$. DOE operator $\hat{D}$ is simply exp[iγ], for which |x|≤α/2, |y|≤α/2.

Currently-used opaque apertures may be replaced with transparent diffractive elements. Currently, undesired modes in a laser cavity are filtered out by an opaque aperture (essentially a low-pass filter). This causes undesired modes to be eliminated through absorption. Although that method works effective in obtaining the fundamental $TEM_{00}$ Gaussian mode, most of the electromagnetic energy gets dissipated. A phase step function can be used in place of the opaque aperture preserving dimensions, as shown in FIG. 20. This phase step function (pi-phase shift is ideal for the best performance) diffracts the other mode keeping the Gaussian, and dissipates zero theoretical energy. Thus, radiation which does not contribute the desired Gaussian, is directed back to the resonator so that in the other round-trip it will be used effectively. This concept finds utility with gas lasers and solid state lasers.

CGH Mirrors

In free-space simulations a unit amplitude plane wave is considered to interact with the CGH. The main question is the viability of diffractive mirrors from the point of view of direct applicability to laser cavities. The feasibility of the structure is shown in FIG. 7, where the output coupler exploits a diffractive mirror to function. The other mirror is planar as before. Two types of benefits result from this configuration: First, mechanically unstable mirrors can be replaced with diffractive structures that are more compatible to the semiconductor unification process, and second, the modes can be shaped very effectively, thus giving rise to larger fundamental mode sizes carrying high power with relatively low dispersion.

Simulation of the structure of FIG. 7 contains two parts. One must first find the appropriate phase relief profile yielding any desired output. Second, the Fox-Li technique is applied to see the modes settled down in the cavity. The diffractive element is the CGH. In the computation the desired image is chosen and considered at the conjugate end of the CGH-location end. This image might be a kind of Gaussian intensity distribution function. Then propagation to the CGH plane is fulfilled. At the CGH plane, the complex conjugate is taken followed by amplitude extraction since the CGH is a phase structure. Explicitly, $$CGH=\Psi*/\Psi, \quad (7)$$

where Ψ is the field at the CGH plane. This formulation leads to the correct CGH to use. After identifying the diffractive surface profile, if the Fox-Li algorithm is applied through the resonator with this designed CGH in place of the curved mirror, one can see the modes formed. FIG. 8(*a*) demonstrates the CGH relief profile, and FIG. 8(*b*) demonstrates the cross-section from the middle. The aperture a is 6 mm with length D, which is 15 cm. FIG. 8(*c*) shows the resultant output with a waist of 2.7 mm.

Example 1 Laser Test

FIG. 9 shows the setup for Example 1. In the laser cavity is a diode-pumped solid-state (DPSS) laser configuration of the well-known Nd:YAG (neodymium-doped yttrium aluminum garnet, $Nd:Y_3Al_5O_{12}$). It is optically pumped by the pump laser at 808 nm. Mirrors with special coatings have been designed for this specific laser operation. Mirror 1 is a concave mirror with a focal length of half a meter. Its coating enables it to reflect almost 100% at 1064 nm, and transmit 100% at 808 nm for pumping. Mirror 2 is a plain mirror with around 90% reflectance at 1064 nm. The high-pass filter at the end lets 1064 nm out and stops 808 nm.

The parameters for the system are as follows: Cavity length D=15 cm. Crystal length l=5 cm. Distance d=5 cm. Aperture a=1-3 mm (variable). Crystal aperture b=3 mm. $R_1$=1 m. $R_2$=∞.

Thus, in this situation, the simulations tell that, for a cylindrical cavity, a multimode result oscillating in the cavity results. When the DOE is inserted, however, a clean Gaussian output is expected. The DOE will be inserted 2 mm away from the aperture of the first mirror.

Example 2 Replacing the Mirror with the CGH in the Open Laser Cavity

The CGH will replace the concave mirror inside the laser cavity. The laser crystal will be the same, i.e., Nd:YAG type. The planar mirror will be completely reflective to 1064 nm. This experiment will be fulfilled using different aperture sizes to confirm simulations in Section 4.2.3. The pump wavelength will be the same.

Example 3

There are mainly two kinds of semiconductor lasers: edge emitting or surface emitting. The latter is called VCSEL and emits light perpendicular to the surface, that is, along the direction of current flow. VCSELs have certain advantages over standard edge-emitting semiconductor lasers, such that the emitted beam can be symmetrical and has much smaller divergence. The cavity is sandwiched between Bragg reflectors, where alternating refractive index materials are placed as dielectric mirrors and quantum well structures are used for mode confinement. When it comes to power, though, high power and good beam quality cannot be achieved simultaneously with these lasers since good beam quality requires a small, stable mode size, while high power may require some degree of instability to achieve a larger mode size. Thus, the power limits stay within the limits of several hundred mWs.

Optically pumped VECSELs have received considerable attention recently, since they can provide excellent beam quality at comparatively high output powers. Their cavity length is elongated by one-sided external cavity mirrors, which in turn affects the mode quality; the longer the cavity is, the larger the lowest-order mode becomes, so that a reduced number of modes are oscillating, leading to greater beam purity even at high powers. Optical pumping instead of electrical pumping, on the other hand, facilitates injection of carriers uniformly across a much wider area than the internal electric field generated by semiconductor current. FIG. 11 shows a conventional VECSEL. DBR functions as a high reflectivity mirror where the light produced by the active medium is confined. The active medium is the main part of a laser, and it can be enhanced by ultra-thin quantum wells (QWs). The elongated mirror improves mode quality at high powers.

We can directly investigate the behavior of the laser above by comparison. Assume that in the VCSEL, D is just equal to the active medium thickness, which will be taken as 1 mm here (note that a mirror has ROC 25 mm; this is an illustrative assumption since it may not be very possible to make that curvature stick to the active medium). The maximum beam diameter (beam waist) in this case is 102 µm by adjusting the aperture diameter a as 170 µm, as shown in FIG. 12(*a*). When we pass to the VECSEL regime by making D equal to 20 mm, we obtain a beam of 325 µm in diameter by making the a 500 µm maximum, referring to FIG. 12(*b*). Aperture values bigger than that will yield higher order modes.

For a large-enough D', the CGH turns into a spherical reflector. To simulate the device above, we chose D' is equal to 10 mm, as an illustration. The CGH and beam output are shown in FIGS. 14(*a*) and 14(*b*), respectively. The beam waist can go up to 1 mm, with different designs of CGHs. Below we obtain a clean output with almost zero diffraction loss with a waist of 850 µm. There will also be quantization on the phase relief structure of the CGH element. The results of quantization can be mentioned briefly. As the allowable levels decrease, beam diameter shrinks as well. For example, when it is 16, the diameter is 760 µm. When it is 8, the diameter is 670 µm. For the results below, no quantization is applied.

Example 4 Finalizing the Design of the Integrated Device

One device of the subject invention mainly consists of two parts: the laser itself and the CGH. The CIVC is shown in FIG. 15.

Laser:

The laser is briefly explained above in general. It is an optically pumped semiconductor laser; incident pump light is absorbed in the pump-absorbing regions. Generated electrons and holes diffuse and are captured by the quantum wells (QWs), where they provide gain for the laser light. The QWs are placed at the antinodes of the optical standing wave, thus forming a resonant periodic gain structure. It is foreseen that the active region will contain the bulk portion made up of AlGaAs and QWs, which consist of strained InGaAs and strain-compensating InGaP. Other appropriately matched compounds may be used as known in the art. Examples are Cd/TE and Hg/Te. The planar mirror is made of layered thin-film structures, DBR, and GaAs (refractive index: 3.47) and AlGaAs (refractive index: 3.6) supported by a substrate. The thickness of the layers of thin films should be a quarter of the resonant wavelength, 1064 nm. The QWs are fairly thin at ~10 nm, and the number of the wells can be one or even around 10-15.

CGH:

The CGH will be responsible for mode shaping, based on the results of the Phase I efforts. Now the cavity length D exactly equals the active medium of almost 1 mm in size. Such a small propagation distance is supposed to be compensated by a diffractive structure. In fact one can come up with different CGH structures depending on the chosen Gaussian parameters, with corresponding pluses and minuses. The CGH structure for this configuration is given in FIG. 16 (a). Its performance is displayed in FIG. 16(b). Now, the max aperture is 650 μm, beam waist is almost 300 μm, close to the real VECSEL value in comparison with FIG. 6-4. Thus, the CGH has elevated the beam waist from 100 μm to almost 300 μm, tripling in value. Note also that 64 levels are used in representing the phase relief. In case lower levels are used, the performance doesn't change much until 4 or 8 levels.

Thus, a CGH may be placed at the end of a diode laser inside the cavity, where the CGH will affect intra-cavity mode formation directly. Semiconductor lasers are high in wall-plug efficiency and robust however suffer from bad beam quality due mainly to small size of active medium. The diffraction effects can somehow be overcome by the application of vertical cavity emitters but the resonator length is still very small. We demonstrate that adding a specially designed CGH inside the cavity will help improve the beam quality. The CGH will be designed so that a large sized Gaussian will be emitted, which, in turn can encircle high energy. The CGH will function to adjust the modes to fulfill that. Design of the CGH requires a back-propagated output (the desired large diameter Gaussian). As a result, the short cavity length problem can be overcome, yielding high-power, good quality diode lasers. This structure (FIG. 15) finds utility in semiconductor lasers.

Example 5 Procuring the CIVC

Fabrication of VECSEL samples is vital to the overall performance since they are low-gain lasers. To maximize performance, high surface quality is necessary to minimize scattering/diffraction losses, and excellent thermal management is needed to prevent thermal roll-over and maximize the laser efficiency. Waste heat is primarily generated due to the quantum defect and must be removed from the active region. To achieve this, a high thermal conductivity (>1800/WmK) chemical vapor deposition (CVD) diamond with high surface quality (peak to valley height <50 nm) is used as the submount/heat spreader. The CVD diamond and the epitaxial side of a small ~4 mm×4 mm piece of VECSEL wafer are metalized with Ti and Au. The wafer piece is then mounted on the CVD diamond by solder bonding with a soft indium solder, which is used because of its high thermal conductivity and ability to reduce thermal stress at the semiconductor/CVD interface, thus providing a long and reliable lifetime for the finished device. After processing has been completed, the remaining VECSEL consists of a DBR stack and active region (FIG. 6-10). This allows for maximum heat extraction efficiency during high pumping. The CVD diamond also has peak-to-valley surface height variations <50 nm, which results in excellent surface quality.

A set of cascaded CGHs inside the laser cavity are used in the structure of FIG. 19. These CGHs increase the effect of each unit by using the free space propagation between elements. In the laser cavity, these layers will also function as DBRs, so there is no need to deposit extra DBR layers. These CGHs are separated by buffer layers with a thickness of a few hundred microns. These CGH layers will reflect the light so that only the intended configuration will propagate and the other formats will get lost as stray light. Here, 'getting lost' means the energy gets back to the active medium for excitation, contributing the desired output.

This structure finds utility in semiconductor lasers.

3.7 Summary

It is generally desired in many laser applications that the power be as high as possible. In many cases, high power can be obtained by operating a device at a high-order mode scheme whose intensity distribution has a larger cross-section than the fundamental Gaussian mode, so it could more efficiently exploit the gain medium. High-order modes can be recovered to less dispersive Gaussian by external or intra-cavity mode shaping. The former includes placing a diffractive element outside the cavity. The use of intra-cavity mode shaping, however, has two main advantages. First, the laser output power is relatively high since a larger volume of the gain medium is exploited. Second, there is no need for external beam shaping, which introduces both additional losses and some distortions to the output intensity distributions. Thus, intra-cavity elements shape the mode inherently, yielding more robust beams for long propagation distance.

The invention claimed is:

1. A Vertical External Cavity Surface Emitting Laser device comprising:
   A laser source with a cavity;
   A DBR mirror on a substrate within the cavity;
   The DBR mirror comprising a plurality of first layers and creating a mode;
   Diffractive elements consisting of a plurality of interior CGHs at an end of the cavity;
   Said CGHs each having a plurality of cascaded second layers with a buffer layer between each layer;
   With the diffractive elements shaping the mode.

2. The device of claim 1 having a laser gain medium that is semiconductor.

3. The device of claim 1 having a laser gain medium that is crystal.

4. The device of claim 1 having a laser gain medium that is gas.

5. The device of claim 1 wherein the plurality of diffractive optical elements comprises 2-20 layers of AlGaAs with buffer layers of GaAs.

* * * * *